(12) United States Patent
Lee et al.

(10) Patent No.: US 9,337,048 B2
(45) Date of Patent: May 10, 2016

(54) METHOD FOR DISCONNECTING POLYSILICON STRINGERS DURING PLASMA ETCHING

(71) Applicant: Macronix International Co., Ltd., Hsinchu (TW)

(72) Inventors: Ching-Hsiung Lee, Hsinchu (TW); Shih-Chang Tsai, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/493,608

(22) Filed: Sep. 23, 2014

(65) Prior Publication Data

US 2016/0086806 A1    Mar. 24, 2016

(51) Int. Cl.
| | | |
|---|---|---|
| H01L 21/336 | (2006.01) | |
| H01L 21/28 | (2006.01) | |
| H01L 29/792 | (2006.01) | |
| H01L 27/115 | (2006.01) | |

(52) U.S. Cl.
CPC .... *H01L 21/28282* (2013.01); *H01L 27/11568* (2013.01); *H01L 29/792* (2013.01)

(58) Field of Classification Search
CPC ............... H01L 27/11521; H01L 21/0274; H01L 21/31144; H01L 21/32139; H01L 27/1052; H01L 29/42324
See application file for complete search history.

(56) References Cited

U.S. PATENT DOCUMENTS

| | | | | |
|---|---|---|---|---|
| 5,933,729 | A * | 8/1999 | Chan | ................. H01L 21/02071 257/E21.682 |
| 6,001,688 | A * | 12/1999 | Rizzuto | ............. H01L 21/02071 257/E21.682 |
| 6,046,085 | A * | 4/2000 | Chan | ................. H01L 27/11521 216/67 |

\* cited by examiner

*Primary Examiner* — Jaehwan Oh
(74) *Attorney, Agent, or Firm* — Stout, Uxa & Buyan, LLP; Frank J. Uxa

(57) ABSTRACT

A method of fabricating wordlines in semiconductor memory structures is disclosed that eliminates stringers between wordlines while maintaining a stable distribution of threshold voltage. A liner is deposited before performing a wordline etch, and a partial wordline etch is then performed. Remaining portions of the liner are removed, and the wordline etch is completed to form gates having vertical or tapered profiles.

8 Claims, 5 Drawing Sheets

METHOD FOR DISCONNECTING POLYSILICON STRINGERS DURING PLASMA ETCHING

BACKGROUND OF THE INVENTION

1. Field of the Invention

The present disclosure relates generally to semiconductor fabrication methods and semiconductor devices and, more particularly, to methods of fabricating wordlines in semiconductor memories and semiconductor devices.

2. Description of Related Art

Semiconductor structures, such as memories and the like, may be organized with multiple parallel conducting paths, known as wordlines, oriented in a direction orthogonal to that of underlying bit lines. The wordlines are formed of conducting material and are electrically isolated from one another.

Maintaining electrical separation of wordlines as semiconductor device dimensions evolve to ever-smaller sizes is an on-going challenge in development of manufacturing processes. The required electrical separation may be compromised by the presence of undesired conducting paths, known as stringers, formed from residual conducting material remaining after one or more etch steps that form the wordlines.

Methods for assuring wordline separation applicable to larger geometries generally may not be effective when manufacturing processes are scaled down, such as to small geometries. For example, one prior art method of eliminating stringers involves forming polysilicon gates with reentrant profiles. While this practice may be effective in preventing formation of stringers, the use of reentrant profiles may cause adverse effects on the distribution of an important parameter for characterizing memory cells, namely threshold voltage, $V_t$, when critical cell dimensions are reduced, for example, to about the 30-40 nanometer range.

Use of reentrant profiles in conjunction with smaller geometries may adversely affect a distribution of $V_t$, a critical voltage level above/below which a memory cell changes state. That is, a width of a $V_t$ distribution may exceed a value deemed acceptable for proper memory cell operation. If the value of $V_t$ for a memory cell is not predictable and/or if values of $V_t$ are too widely distributed, then operation of the memory cell becomes unreliable with concomitant negative consequences for yield and manufacturing cost. The distribution of values for $V_t$ should be relatively narrow in order for memory cells to function properly.

Attempts to solve the $V_t$ distribution problem by replacing reentrant profiles with vertical or tapered profiles may result in random single-bit failures due to polysilicon stringers that are not removed.

Thus, a need exists in the prior art for memory devices having a relatively narrow threshold voltage ($V_t$) distribution and for a method of manufacturing such memory devices. A further need exists for a method of eliminating the effect of stringers in memory devices having small geometries.

SUMMARY

The present disclosure addresses these needs, for example, by providing a storage layer, dielectric and conducting structures, an overlying conducting layer, and one or more hard mask layers configured as a semiconductor stack. The stack may be patterned to facilitate etching to form wordlines. The semiconductor stack may be overlaid with liner material, and a first etch may be performed to remove a horizontal portion of liner material and a portion of the overlying conducting layer. One or more additional etches, for example, a second etch, may remove remaining liner material, and a third etch may remove conducting material, thereby creating wordlines disconnected or independent from each other with associated gates having a narrow distribution of threshold voltage.

In one example, the providing of a storage layer may comprise providing an oxide-nitride-oxide (ONO) layer, the providing of dielectric structures may comprise providing structures formed of oxide material such as silicon dioxide, the providing of conducting structures may comprise providing structures formed of polycrystalline silicon (polysilicon), and the providing of the overlying conducting layer may comprise providing another layer formed of polysilicon. The dielectric and conducting structures may be disposed in a side-by-side configuration overlying the storage layer.

In one example, the providing of one or more hard mask layers may comprise providing a first hard mask layer overlaid by a second hard mask layer, for example, wherein the hard mask layers are spaced apart by less than about 70 nm, and the hard mask layers have a width of less than about 70 nm.

While the methods and structures have or will be described for the sake of grammatical fluidity with functional explanations, it is to be expressly understood that the claims, unless indicated otherwise, are not to be construed as limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing the present invention, certain aspects, advantages and novel features of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

DETAILED DESCRIPTION OF THE INVENTION

Figure 1:
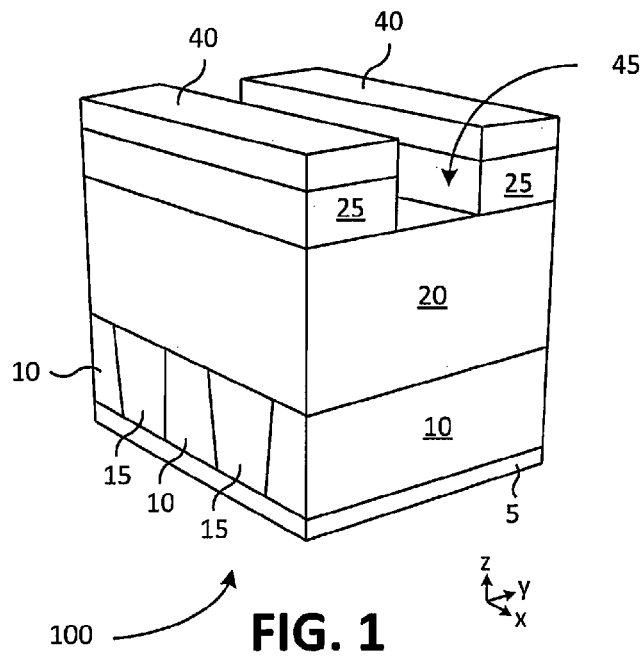
FIG. 1 is a perspective view of a prior-art semiconductor film stack at a manufacturing stage preparatory to formation of wordlines.

Examples are now presented and illustrated in the accompanying drawings, instances of which are to be interpreted to be to scale in some implementations while in other implementations, for each instance, not. In certain aspects, use of like or the same reference designators in the drawings and description refers to the same, similar or analogous components and/or elements, while according to other implementations the same use should not. According to certain implementations, use of directional terms, such as, top, bottom, left, right, up, down, over, above, below, beneath, rear and front, are to be construed literally, while in other implementations the same use should not. The examples may be practiced in conjunction with various integrated circuit fabrication and other techniques that are conventionally used in the art, and only so much of the commonly practiced process steps are included herein as are necessary to provide an understanding of the examples presented. The examples described herein have applicability in the field of semiconductor devices and processes in general. For illustrative purposes, however, the following description pertains to semiconductor memory circuits and a related method of manufacture.

Referring more particularly to the drawings, FIG. 1 is a perspective view of a portion of a prior-art semiconductor film stack 100 at a manufacturing stage preparatory to formation of wordlines using a known method of self-aligned double patterning (SADP). The diagram includes x-y-z axes that may be used for spatial reference in this and other figures presented herein. The film stack 100 includes a storage layer that may be formed, for example, as an oxide-nitride-oxide (ONO) layer 5 on a silicon substrate (not shown). The ONO layer 5 may have a thickness ranging from about 50 Å to about 300 Å with a typical value of about 200 Å. The ONO layer 5 may be disposed under a layer comprising alternating parallel structures of conductive polycrystalline silicon (polysilicon) 10 and dielectric material, for example, oxide, for example, buried oxide (BD oxide), 15 that extend in a y-direction. A thickness of the oxide structures 15 and polysilicon structures 10 may range from about 300 Å to about 700 Å, and be about 500 Å thick in typical implementations. The oxide structures 15 may comprise high-density plasma (HDP) according to one example.

The polysilicon structures 10 and oxide structures 15 are overlaid with a polysilicon layer 20 having a thickness that may be, as a minimum, about 400 Å, and as a maximum, about 1000 Å, with a typical value of about 700 Å. The overlying polysilicon layer 20 makes electrical contact with the polysilicon structures 10. Two hard mask layers 25 and 40 separated by space 45 are disposed over the polysilicon layer 20 and are configured to facilitate etching to form wordlines. In particular, the first or lower hard mask layer 25, which may be formed of tetraethyl orthosilicate (TEOS), may be disposed over the polysilicon layer 20 to a thickness ranging between about 400 Å and about 1200 Å, typically about 800 Å. The second or upper hard mask layer 40 may be formed of, for example, polysilicon and the like, and may be disposed over the first hard mask layer 25 to a thickness ranging from about 300 Å to about 700 Å, typically about 500 Å.

Figure 2:
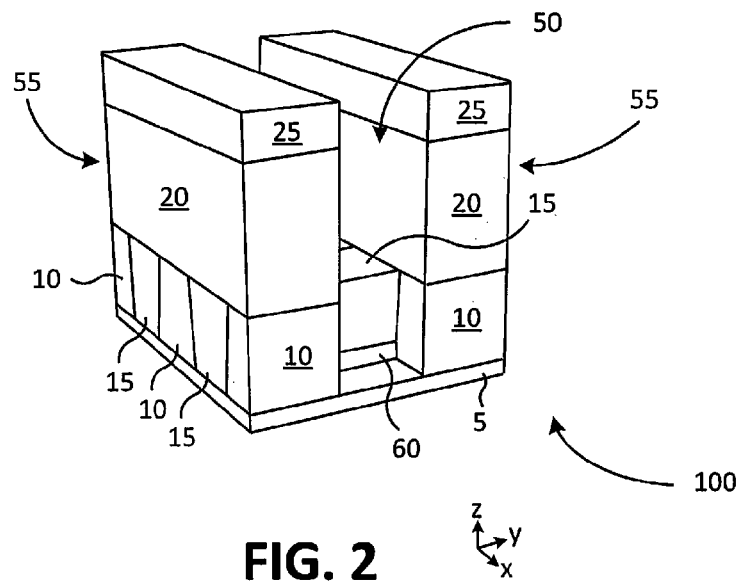
FIG. 2 shows an effect of etching to remove polysilicon from the prior-art film stack of FIG. 1 and illustrates a presence of stringers.

An anisotropic wordline etch, using (an) etchant(s) such as CF4/C12/HBr/O2, and the like may be performed on the structure of FIG. 1 to remove material in the polysilicon layer 20 and the polysilicon structures 10 according to the pattern established by the first hard mask 25. The wordline etch, which may effectively remove the second hard mask layer 40, may create a structure such as is illustrated in FIG. 2, whereby polysilicon material in a space 50 is removed to form wordlines 55 extending in an x-direction, that is, a direction perpendicular to underlying bitlines (not shown), and forming associated polysilicon gates at wordline/bitline intersections. In an ideal situation, all conducting material (e.g., polysilicon) in the space 50 is removed by the wordline etch, thereby exposing naked oxide structures 15 and electrically disconnecting wordlines 55. Instead, an overhang in the oxide structures 15 may effectively shield and prevent removal of a portion, for example, a small portion, such as about 1% or less to about 10% of the polysilicon material between wordlines during the etch. The portion that is not removed may be referred to as a stringer, such as stringer 60 shown in FIG. 2. The stringer 60 constitutes a parasitic electrical connection between wordlines 55 that creates a conductive path, for example, an unwanted or detrimental conductive path, between remaining portions of the polysilicon structures 10.

One method for eliminating the stringers, e.g., stringer 60, is to perform an over-etch when creating the space 50. A result of applying this method is illustrated in a structure 200 in FIG. 3, in which a stringer, such as stringer 60 (in FIG. 2), is removed, leading to clean sidewalls 70 of the oxide structures 15. However, the over-etch may produce an undercut 72 of the polysilicon structures 10, thereby creating a gate having a reentrant profile 75 with a critical dimension 74 that is not well-controlled. The reentrant profile 75, therefore, may lead to a $V_t$ with a distribution having a width that exceeds an acceptable value.

Figure 3:
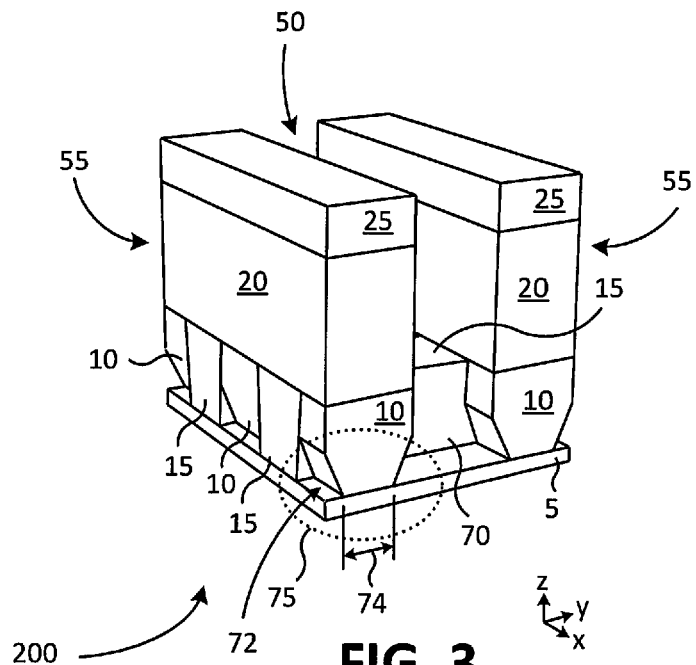
FIG. 3 depicts an effect of an over-etch to remove the stringers from the structure of FIG. 2, demonstrating formation of an undercut that creates a polysilicon gate having a reentrant profile.

The present disclosure addresses the difficulties with prior-art methods, such as described above with reference to. FIGS. 1-3.

Figure 4:
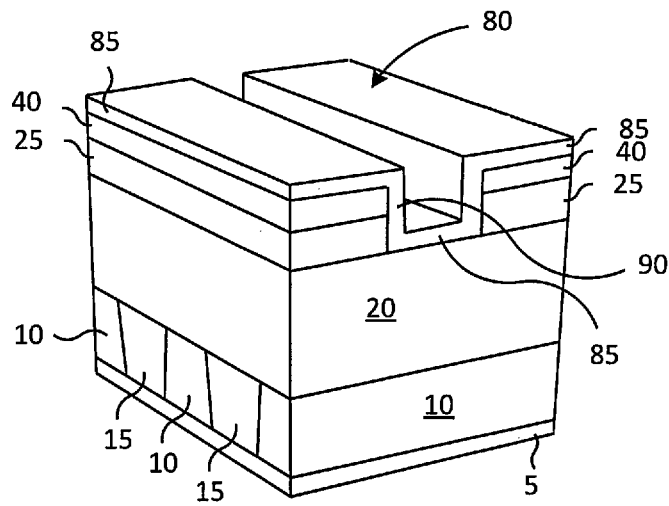
FIG. 4 is a perspective view of a semiconductor film stack similar to that of FIG. 1 with an added liner overlay.

FIG. 4 illustrates one example of a semiconductor film stack 300 configured to solve the problems of the prior art already identified. The film stack 300 is similar to film stack 100 of FIG. 1, comprising an ONO layer 5, polysilicon structures 10, oxide structures 15, a polysilicon layer 20, and hard mask layers 25/40, each of the layers and structures having dimensions/thicknesses that may be similar to corresponding layers and structures of the film stack 100 of FIG. 1.

The film stack 300 is further overlaid with a liner 80. The liner 80, which may be formed, for example, by depositing one or more of such materials as silicon nitride (SIN, e.g., $Si_3N_4$), may comprise relatively thin horizontal portions 85 with a thickness that may range from about 50 Å to about 350 Å, with a typical value of about 200 Å. A vertical portion 90 of the liner 80 may be relatively thin when measured in a y-direction, but may have a thickness greater than the sum of the thicknesses of the first hard mask layer 25, the second hard mask layer 40, and the thickness of the horizontal portion 85 of the liner 80 when measured in a z-direction.

Figure 5:
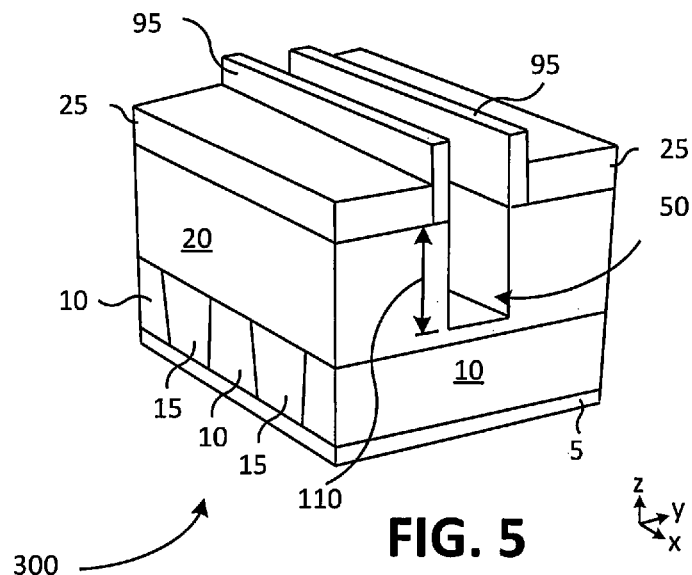
FIG. 5 describes an effect of a partial wordline etch on the film stack of FIG. 4 that removes a portion of the liner overlay and a portion of a polysilicon layer.
Figure 6:
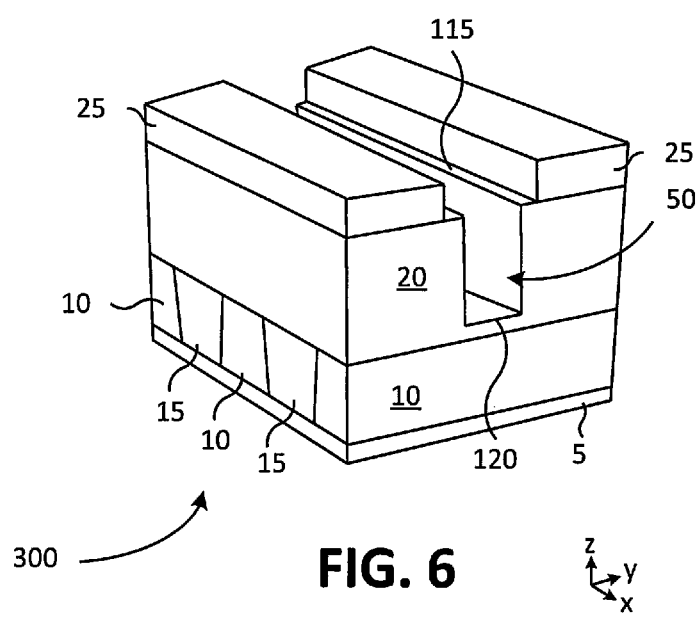
FIG. 6 shows an effect of etching the structure of FIG. 5 to remove the remainder of the liner overlay, thereby creating a polysilicon shelf.

Subsequent to deposition of the liner layer 80, a partial anisotropic wordline etch may be performed. The wordline etch may use (an) etchant(s) such as Cl2/HBr/O2/CF4 and the like having a relatively high selectivity of polysilicon and liner material with respect to the material of the first hard mask 25 (e.g., TEOS). A result of the partial wordline etch may appear as depicted in FIG. 5. In one example, the partial wordline etch continues to a depth 110 in the polysilicon layer 20, the depth 110 ranging from about 200 to about 600 Å with a typical value of about 400 Å. The partial wordline etch may remove substantially the entire horizontal portion 85 (FIG. 4) of the liner 80 as illustrated in FIG. 5. However, because of the greater (z-direction) thickness of the vertical portion 90 of the liner 80, relatively little of the material in the vertical portion 90 may be removed. Accordingly, vertically-oriented strips 95 of the liner 80 may remain in place on sides of an opening 50 created by the partial wordline etch. The remaining liner material 80, for example, the vertical strips 95, may then be removed by etching with a solvent such as HF (Hydrofluoric acid), H3PO4 (Phosphoric acid), and the like, having a high selectivity of liner material to polysilicon, to expose a shelf 115 of polysilicon material on edges of the opening 50, which may have a bottom surface 120 as illustrated in FIG. 6.

An effect of the placement and removal of the vertical portion 95 of the liner 80 may be to inhibit etching of polysilicon material below the vertical portion 95, thereby acting, or being effective, to cause or begin to cause the wordline etch to preferentially remove polysilicon material 20 in a middle portion of the opening 50.

Figure 7:
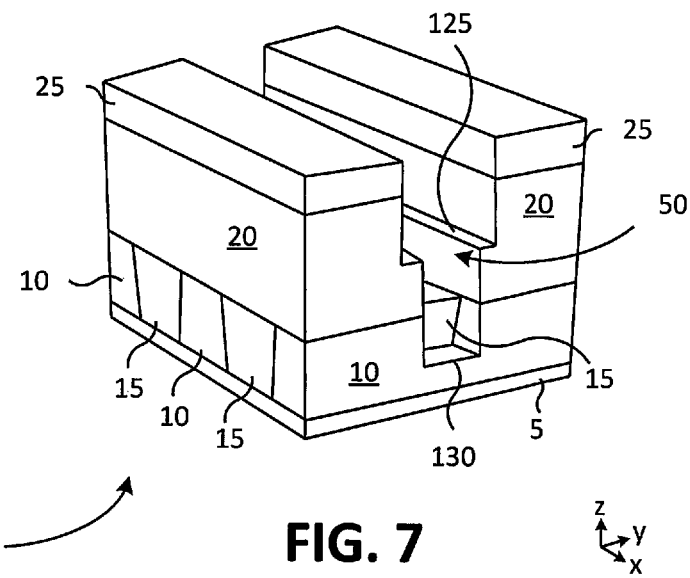
FIG. 7 presents an appearance of the structure of FIG. 6 at an intermediate stage of progression of a final wordline etch.

A final wordline etch then may remove remaining material from polysilicon layer 20 and polysilicon structures 10 not protected by the hard mask 25. To facilitate visualization of the process, FIG. 7 describes an appearance of the structure 300 at an intermediate stage of this final wordline etch. It may be noted, in FIG. 7, that the etch process has lowered the shelf 115 (FIG. 6) and the bottom surface 120 (FIG. 6) to respective new positions 125 and 130, with a portion of the oxide layer 15 also exposed by the wordline etch at this intermediate stage.

Figure 8:
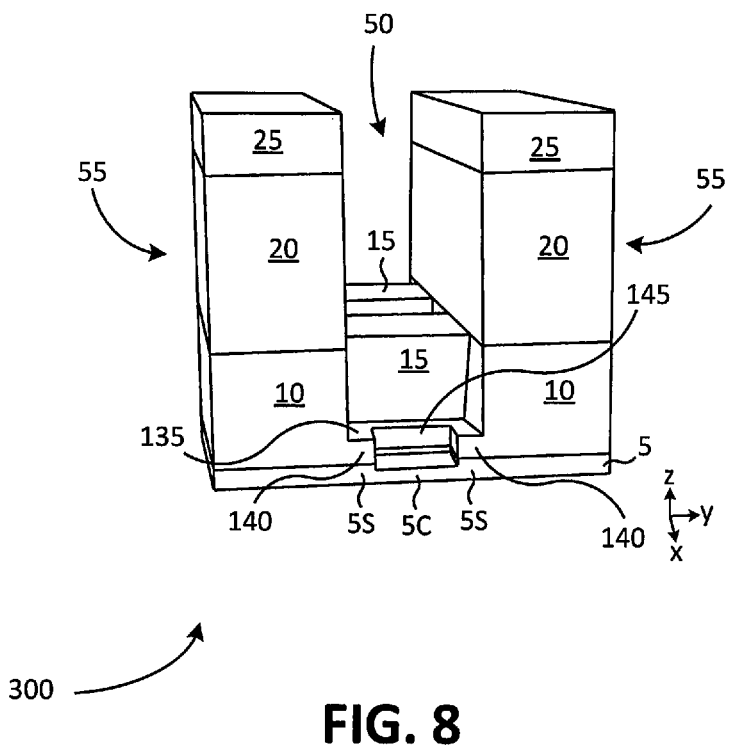
FIG. 8 depicts the structure of FIG. 7 after a further progression of the final wordline etch.

As the final wordline etch proceeds, the bottom surface 130 of the opening 50 eventually reaches a top surface of the ONO layer 5, at which stage the structure may appear as illustrated in FIG. 8 where, as a result of the placement and removal of the vertical portion 95 of the liner 80, as noted above, a portion of the polysilicon layer 10 at edges of the opening 50 is not removed when substantially all of the polysilicon structures 10 in a middle portion (in a y-direction) of the opening 50 has been removed. While a stringer 135 may be present, a center portion 145 of the stringer 135 is thinner (in an x-direction) than outer portions 140 thereof. Since the center portion of the ONO layer 5 will be exposed first, as the final wordline etch proceeds, after the etch is completed, that is after step 420 in FIG. 10, the center portion SC of the ONO layer 5 is thinner than the side portion 5S of the ONO layer. In one example, the center portion of the top oxide or nitride of the ONO layer 5 may be completely or substantially completely consumed, for example, during the final wordline etch.

Figure 9:
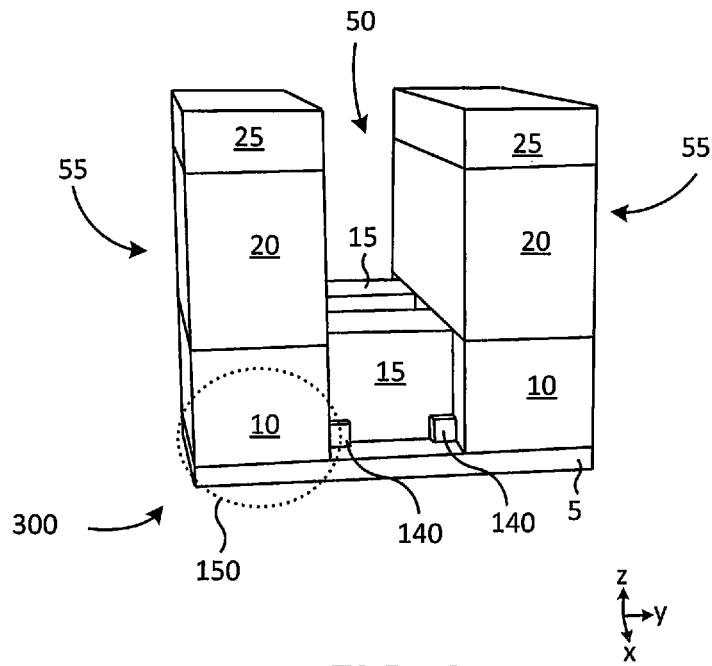
FIG. 9 illustrates an effect of an over-etch to complete the final wordline etch on the structure of FIG. 8 showing that polysilicon stringers between wordlines are disconnected.

Continuing the wordline etch (i.e., over-etching) at the stage illustrated in FIG. 8 may substantially completely remove the thin portion 145 of the stringer 135 and may reduce the size of the outer portions 140 as illustrated in FIG. 9. That is, the polysilicon under the removed liner 95 (FIG. 5), which has been referred to as the shelf 115/125 (FIGS. 6/7), may be etched to stop when the ONO layer 5 is reached. The outer portions 140 of the stringer 135 may thereby protect remaining polysilicon structures 10 from being undercut during the over-etch that removes the center portion 145 of the stringer 135. That is, a reentrant profile is advantageously not created, for example, during the over-etch.

It may be noted, for example, in the structure of FIG. 9, that the outer portions 140 of the stringer 135 (FIG. 8) are not connected, so that electrical conduction between adjacent wordlines 55 is not possible. The profile 150 of the resulting gates may therefore be vertical or tapered, which may be associated with a relatively narrow distribution of values for threshold voltage, $V_t$. Narrowly-distributed values for threshold voltage may lie in a range between about 1.5 volts and about 5 volts, with a typical value for $V_t$ being about 3.5 volts.

Figure 10:
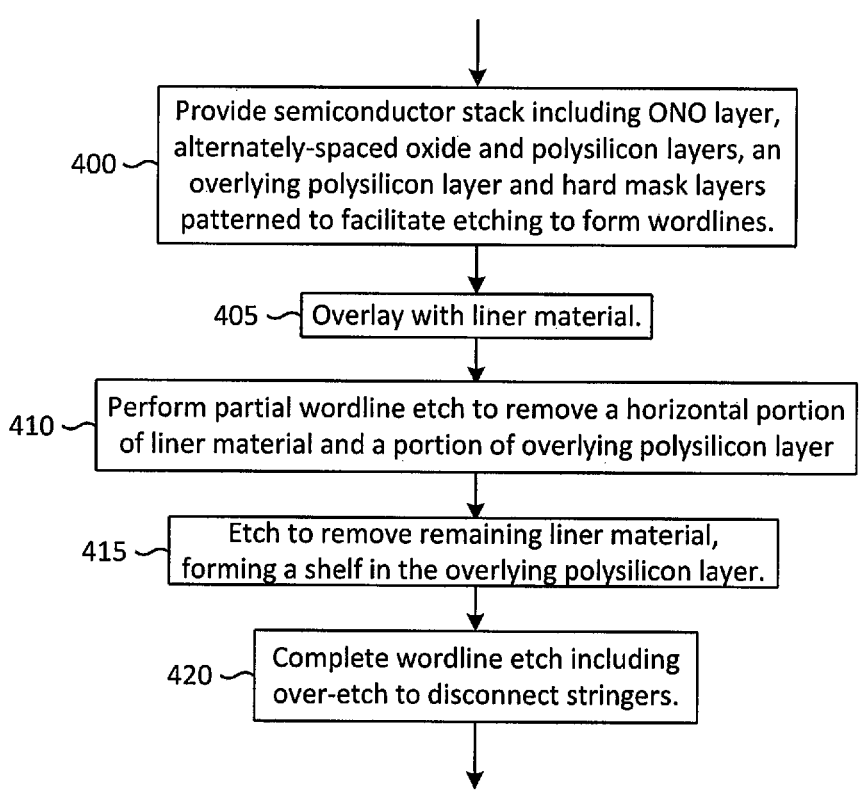
FIG. 10 is a flowchart summarizing a method of disconnecting stringers.

FIG. 10 is a flowchart that describes one implementation of a method of the present invention. The implementation comprises providing a semiconductor film stack at step 400. The semiconductor stack may be similar to the film stack 100 illustrated in FIG. 1 configured for fabrication of wordlines. The film stack 100 in the present example comprises a storage layer 5, which may be an ONO layer, that is overlaid with side-by-side parallel structures of conducting material such as polysilicon structures 10 and dielectric material, such as BD oxide structures 15. The polysilicon and oxide structures 10/15 in the illustrated example are overlaid by a conducting layer in a form of a polysilicon layer 20. Hard mask layers comprising a first hard mask layer 25, which may be formed of, for example, TEOS, and a second hard mask layer 40 comprising polysilicon may overlie the polysilicon layer 20 with the first hard mask layer 25 being in contact with the polysilicon layer 20 and the second hard mask layer 40 being formed on the first hard mask layer 25. The hard mask layers 25/40 may be formed in strips having a space 45 between them. According to prior-art practices, wordlines may be formed in the film stack 100 by performing a wordline etch that removes material between the strips.

In contrast with prior-art methods, the present implementation provides or includes at step 405 depositing a layer of liner material over the semiconductor film stack 100 to form, for example, a structure similar to the film stack 300 illustrated in FIG. 4 showing a liner 80 overlying a structure similar to film stack 100 (FIG. 1).

The liner 80 maybe formed of material such as a silicon nitride, SIN (e.g., $Si_3N_4$) in some examples. In some examples, the liner 80 may be formed of other liner materials including a dielectric antireflective coating (DARC) or polymers such as fluorohydrocarbon polymers (CxHyFz) and the like. The liner 80 may comprise a relatively thin horizontal portion 85 and a relatively thick (for example, measured in a z-direction) vertical portion 90.

With reference to FIGS. 4 and 5, a partial wordline etch may be performed at step 410 to remove substantially the entire horizontal portion 85 of the liner 80. The partial wordline etch, further, may remove at least a portion of the polysilicon layer 20 in an interior region of a space 50 between strips of hard mask layers, while not removing a significant amount of the vertical portion 90 of the liner 80, thereby leaving vertical strips 95 of liner material as shown in FIG. 5. According to one implementation of the method, the partial wordline etch is performed using a(n) etchant(s) such as CF4/C12/HBr/O2 and continues until reaching a depth 110 in the polysilicon layer 20. The depth 110 may range from about 200 to about 600 Å, typically about 400 Å.

The vertical strips 95 of liner material then may be removed at step 415 by etching with a solvent such as HF or H3PO4 and the like, thereby forming a shelf 115 on edges of the space 50 in the polysilicon layer 20 as shown in FIG. 6. The partial wordline etch performed at step 410 thereby acts, or is effective, to cause or begin to cause the wordline etch to preferentially remove material in an interior portion of the space 50.

The wordline etch may be completed at step 420 to remove portions of the polysilicon structures 10 adjacent the BD oxide structures 15. If stringers, such as stringer 135 in FIG. 8, are formed in the process, they may be removed by continuing the wordline etch into an over-etch stage, whereby polysilicon under the removed liner material 95 (FIG. 5) is etched and the etching is stopped upon reaching the ONO layer 5. The liner material and the preferential etching provided by the partial wordline etch at step 410 may be effective in providing that any stringer material remaining after completion of step 420 (e.g., remaining portions 140 of stringer 135 shown in FIGS. 8 and 9) does not permit electrical conduction between wordlines 55. Further, the process just described may create a tapered or vertical (i.e., not reentrant) polysilicon gate profile, thereby forming polysilicon gates advantageously having a relatively narrow distribution of threshold voltage, $V_t$.

Although the disclosure herein refers to certain illustrated embodiments, it is to be understood that these embodiments have been presented by way of example rather than limitation. The intent accompanying this disclosure is to have such embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention as limited only by the appended claims.

What is claimed is:

1. A semiconductor memory device comprising:
   a storage layer;
   a plurality of wordlines disposed above the storage layer in a direction orthogonal to an underlying plurality of parallel bitlines, thereby forming a plurality of polysilicon gates, whereby:
   the wordlines do not exhibit a reentrant profile in a region near the storage layer;
   the storage layer includes a storage layer region between the wordlines including a center portion and two side portions, the center portion being thinner than each of the two side portions; and
   a threshold voltage of about 3.5 volts is associated with the polysilicon gates.

2. The semiconductor memory device of claim 1, wherein the storage layer is an oxide-nitride-oxide layer.

3. A semiconductor device comprising:
   a storage layer;
   dielectric and conducting structures disposed in a side-by-side configuration overlaying the storage layer;
   a plurality of wordlines formed by etching and disposed above the storage layer, the wordlines not exhibiting a reentrant profile; and
   the storage layer includes a storage layer region between the wordlines including a center portion and two side portions, the center portion being thinner than each of the two side portions.

4. The semiconductor device of claim 3, wherein the storage layer is an oxide-nitride-oxide layer.

5. The semiconductor memory device of claim 1 which includes polysilicon structures, oxide structures and a hard mask layer.

6. The semiconductor device of claim 3, wherein the dielectric and conducting structures include polysilicon structures, oxide structures and a hard mask layer.

7. The semiconductor device of claim 3, wherein the plurality of wordlines are disposed above the storage layer in a direction orthogonal to an underlying plurality of parallel bitlines, thereby forming a plurality of polysilicon gates.

8. The semiconductor device of claim 7, wherein a threshold voltage of about 3.5 volts is associated with the polysilicon gates.

* * * * *